(12) United States Patent
Nakagawa

(10) Patent No.: US 12,094,886 B2
(45) Date of Patent: Sep. 17, 2024

(54) DISPLAY PANEL AND METHOD FOR MANUFACTURING DISPLAY PANEL

(71) Applicant: SAKAI DISPLAY PRODUCTS CORPORATION, Sakai (JP)

(72) Inventor: Hidetoshi Nakagawa, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 810 days.

(21) Appl. No.: 17/254,037

(22) PCT Filed: Jun. 20, 2018

(86) PCT No.: PCT/JP2018/023524
§ 371 (c)(1),
(2) Date: Dec. 18, 2020

(87) PCT Pub. No.: WO2019/244288
PCT Pub. Date: Dec. 26, 2019

(65) Prior Publication Data
US 2021/0265391 A1   Aug. 26, 2021

(51) Int. Cl.
*H01L 27/12* (2006.01)
*G02F 1/1362* (2006.01)
*G09G 3/3266* (2016.01)
*G09G 3/36* (2006.01)
*G02F 1/1368* (2006.01)
(Continued)

(52) U.S. Cl.
CPC ......... *H01L 27/124* (2013.01); *G09G 3/3266* (2013.01); *G09G 3/3677* (2013.01); *H01L 27/1259* (2013.01); *G02F 1/136204* (2013.01); *G02F 1/1368* (2013.01); *G09G 2330/04* (2013.01); *H10K 59/1201* (2023.02); *H10K 59/1213* (2023.02)

(58) Field of Classification Search
None
See application file for complete search history.

(56) References Cited

U.S. PATENT DOCUMENTS

| | | | | |
|---|---|---|---|---|
| 5,227,901 A | * | 7/1993 | Iizuka | G02F 1/1365 349/40 |
| 5,677,745 A | * | 10/1997 | Kawano | G02F 1/136204 349/39 |
| 2015/0372025 A1 | * | 12/2015 | Misaki | H01L 27/1225 257/43 |

FOREIGN PATENT DOCUMENTS

| | | |
|---|---|---|
| CN | 104956475 A | 9/2015 |
| JP | 2003-248235 A | 9/2003 |

* cited by examiner

*Primary Examiner* — Cory W Eskridge
(74) *Attorney, Agent, or Firm* — ScienBiziP, P.C.

(57) ABSTRACT

A display panel comprises: a plurality of pixels formed on a surface of a substrate; one or more drive circuits formed on the surface to supply signals to the pixels lining up; and a plurality of conductor patterns formed on the surface, electrically separated from each other, and each partially configuring the drive circuit. The conductor patterns comprise: a first conductor pattern having a first element forming portion configuring a part of a first circuit element of the drive circuit; and a second conductor pattern having a second element forming portion configuring a part of a second circuit element of the drive circuit. A discharge portion to narrow an interval between the first and second conductor patterns so as to be partially narrower than an interval between the first and second element forming portions is provided to the first conductor pattern and/or the second conductor pattern.

17 Claims, 7 Drawing Sheets

(51) Int. Cl.
*H10K 59/12* (2023.01)
*H10K 59/121* (2023.01)

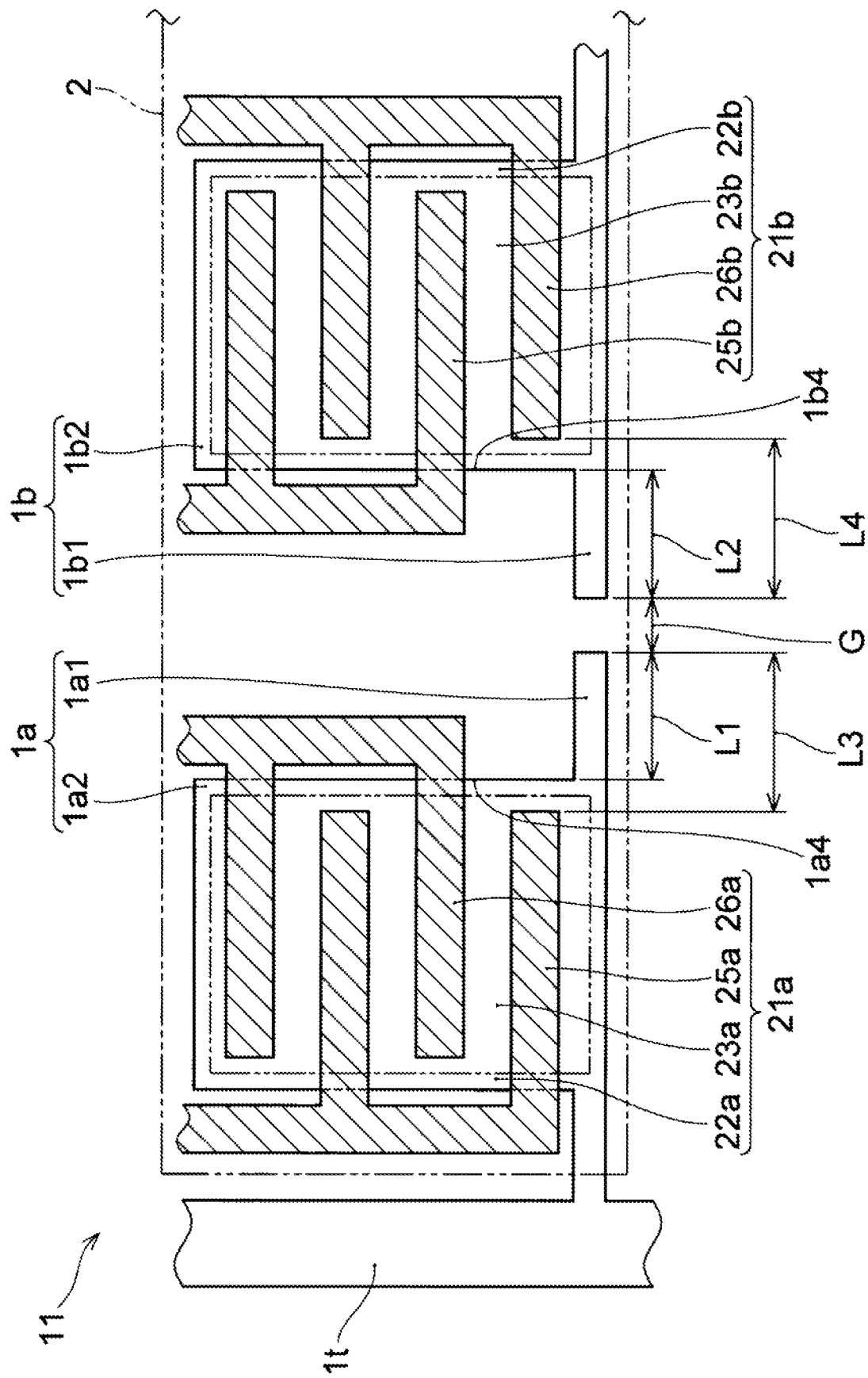

DISPLAY PANEL AND METHOD FOR MANUFACTURING DISPLAY PANEL

TECHNICAL FIELD

The invention relates to a display panel and a method for manufacturing display panel.

BACKGROUND ART

A liquid crystal display panel and an organic-EL display panel to be used for a display of a mobile device or a screen of a television receiver comprise a plurality of pixels being arranged in a matrix, and a pixel drive circuit to operate such that light having a desired luminance is emitted is provided in each of the pixels. The pixel drive circuit is primarily configured by one or more thin-film transistors formed on a substrate being formed of a glass material, for example. For example, a scanning signal (a gate signal) is supplied to a gate electrode of a thin-film transistor for each of the pixels being lined up in the same row, a data signal (a source signal) based on a desired luminance is supplied to a source electrode of the thin-film transistor for each of the pixels being lined up in the same column, and an image is displayed based on these signals.

In the manufacturing process of the display panel, a high voltage can be applied due to static electricity to each of electrodes of the thin-film transistors configuring the pixel drive circuit. Connecting a gate electrode and a source electrode of all the thin-film transistors configuring the pixel drive circuit of each of the pixels via a wiring (a shunt wiring) being provided in a margin portion of a mother substrate in the manufacturing process of the display panel to prevent a breakdown due to such static electricity is being proposed (see Patent document 1, for example). In a liquid crystal display apparatus in Patent document 1, a wiring portion is further provided in at least one of the shunt wiring, and a short ring being formed along the edge of a mother substrate, the wiring portion projecting toward the other of the shunt wiring and the short ring.

PRIOR ART DOCUMENT

Patent Document

Patent Document 1: JP2003-248235 A

SUMMARY OF THE INVENTION

Problem to be Solved by the Invention

The previously-described source signal and gate signal are supplied, to a pixel drive circuit, from a drive circuit called a source driver and a drive circuit called a gate driver (or a scan driver). In recent years, a technique has been introduced to form these drive circuits on a display panel, and examples to form the gate driver on the display panel are particularly on the increase. In that case, the gate driver can also be configured primarily by thin-film transistors, making it possible to form the gate driver in parallel in the process in which the previously-described pixel drive circuit is formed. In other words, the process of preparing the gate driver separately from the display panel can be omitted, making it possible to reduce material and processing costs in an electronic apparatus using the display panel.

However, in a case that the gate driver is formed on the display panel, in the manufacturing process of the display panel, circuit elements such as the thin-film transistors configuring the gate driver could be exposed to a high voltage (a surge voltage) caused by static electricity described previously. Moreover, the configuration of a circuit configuring the driver is normally different from the configuration of the previously-described pixel drive circuit, so that it is difficult to apply a method disclosed in Patent document 1, the method being aimed at protecting the pixel drive circuit, to protection of the gate driver. Even more, unlike each of the pixel drive circuits in which an effect at the time of breakage can remain in one pixel (one sub-pixel), a basic function of the display panel being displaying of an image can be impaired when the gate driver is broken due to electrostatic discharge (ESD), for example.

Thus, an object of the invention is to provide a display panel comprising, at the interior thereof, a drive circuit to supply a signal to each of pixels being lined up in each of rows or each of columns, wherein the display panel can avoid damaging of a drive circuit due to ESD, such as to hinder displaying of an image, and a method for manufacturing such a display panel.

Means to Solve the Problem

A display panel according to a first embodiment of the present invention comprises: a plurality of pixels being formed on a surface of a substrate and being arranged in a matrix; one or more drive circuits being formed outside an image display portion configured by the plurality of pixels on the surface to supply a signal to pixels being lined up in a same row or a same column in the plurality of pixels; and a plurality of conductor patterns being formed on the surface and being electrically separated from each other, each one of the plurality of conductor patterns configuring a part of the drive circuit, wherein the plurality of conductor patterns comprises a first conductor pattern comprising a first element forming portion configuring a part of a first circuit element of any of the one or more drive circuits and a second conductor pattern comprising a second element forming portion configuring a part of a second circuit element of any of the one or more drive circuits; and a discharge portion is provided to at least one of the first conductor pattern and the second conductor pattern, wherein the discharge portion narrows an interval between the first conductor pattern and the second conductor pattern so as to be partially narrower than an interval between the first element forming portion and the second element forming portion.

A method for manufacturing display panel according to a second embodiment of the present invention at least comprises: forming a pixel drive circuit by forming a plurality of thin-film transistors on a surface of a substrate; forming a plurality of pixels by forming a liquid crystal layer or an organic light-emitting layer on the pixel drive circuit; and forming a drive circuit to supply a signal to the pixel drive circuit by forming at least one circuit element in a region to be outside of the plurality of pixels on the surface, wherein in forming of the drive circuit and the pixel drive circuit, a plurality of conductor patterns configuring a part of the drive circuit and being electrically separated from each other is formed on the surface of the substrate; in forming of the plurality of conductor patterns, a first conductor pattern and a second conductor pattern are formed, the first conductor pattern comprising a first element forming portion configuring a part of a first circuit element of the drive circuit and the second conductor pattern comprising a second element forming portion configuring a part of a second circuit element of the drive circuit; and in forming of the first conductor pattern and the second conductor pattern, a discharge portion is provided to at least one of the first conductor pattern and the second conductor pattern, wherein the discharge portion narrows an interval between the first conductor pattern and the second conductor pattern so as to be partially narrower than an interval between the first element forming portion and the second element forming portion.

Effects of the Invention

The first embodiment of the invention makes it possible to avoid damaging of a drive circuit due to ESD, such as to hinder displaying of an image in a display panel comprising, at the interior thereof, a drive circuit to supply a signal to each of pixels being lined up in each of rows or each of columns. Moreover, the second embodiment of the invention makes it possible to manufacture a display panel comprising, at the interior thereof, a drive circuit not being damaged in such a manner as to hinder displaying of an image.

BRIEF DESCRIPTION OF THE DRAWINGS

FIG. 4A shows a plan view of one example of a discharge portion in the display panel according to embodiment 1.

EMBODIMENT FOR CARRYING OUT THE INVENTION

Figure 1:
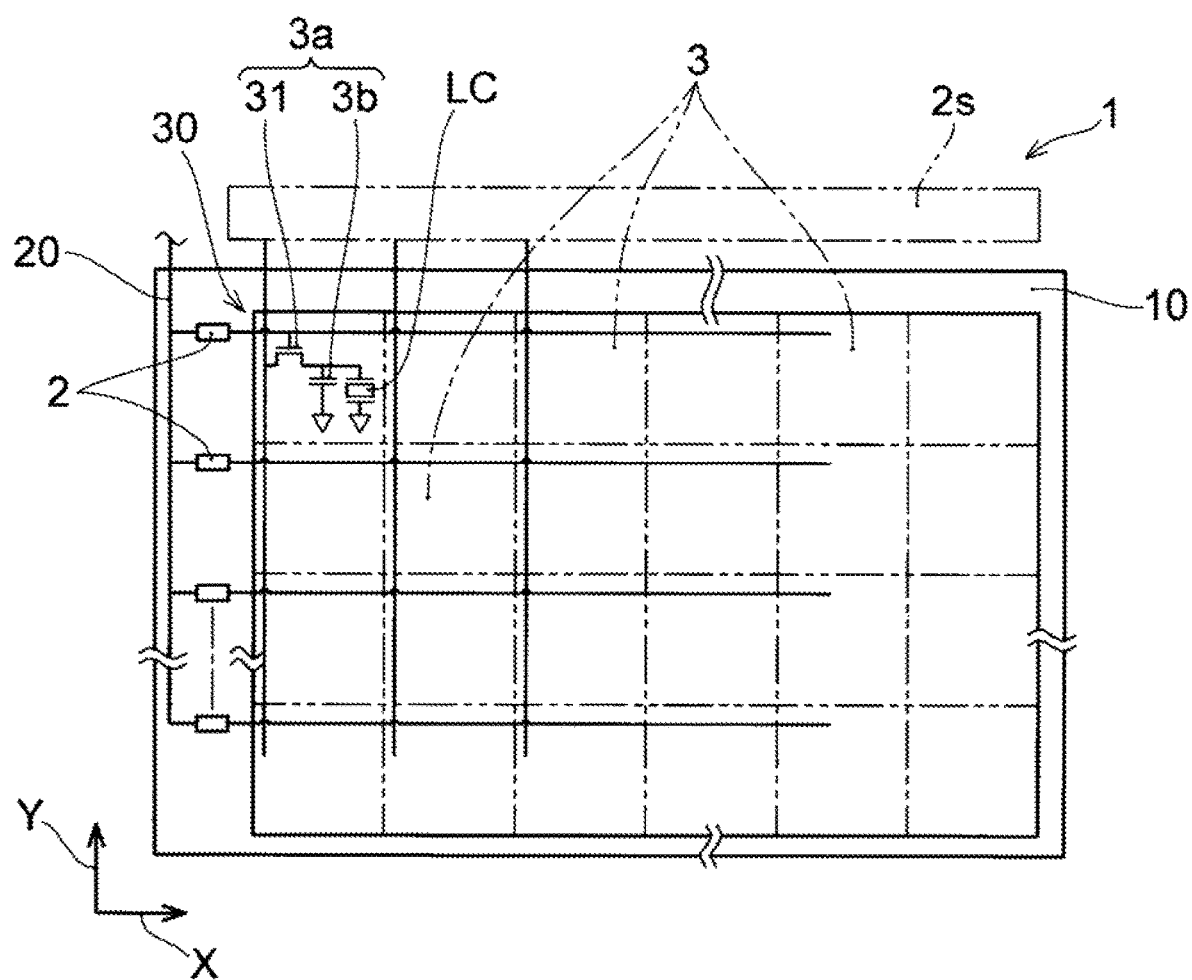
FIG. 1 schematically shows one example of the configuration of a display panel according to embodiment 1 of the present invention.

The inventor has made intensive studies to avoid damaging of a drive circuit to be formed on a display panel, such as a gate driver. Then, the inventor has found that a leakage of current being observed in a failed thin-film transistor in the gate driver is not caused by an insulation breakdown occurring between a source electrode or a drain electrode, and a gate electrode. In other words, the inventor has found that ESD occurs between adjacent conductor patterns in a gate metal layer in which the gate electrode is formed, a gate insulating layer is partially damaged due to the ESD, and as a result of the damage, a leakage occurs in the gate insulating layer.

The thin-film transistors configuring the drive circuit to be formed in the display panel, such as the gate driver, are, as described previously, formed together with thin-film transistors configuring a pixel drive circuit. For example, first, a gate metal layer comprising a portion to be the gate electrode of each of the thin-film transistors is formed on a substrate and patterned into a plurality of conductor patterns configuring the gate electrode of each of the thin-film transistors and a predetermined wiring. The gate insulating layer covering each of these conductor patterns in the gate metal layer are formed by chemical vapor deposition (CVD), for example. Moreover, a semiconductor layer comprising a channel region of the thin-film transistor is formed on the gate insulating layer and patterned into a predetermined shape. Then, a source metal layer is formed, and the source electrode and the drain electrode are formed by patterning the source metal layer. It has been confirmed that static electricity occurs primarily at the time of forming of the gate insulating layer in the above-described series of processes, and ESD is induced, by electric charges accumulated at individual conductor patterns of the gate metal layer, in between each of the conductor patterns, and as a result of that, the gate insulating layer is damaged or deteriorated. The ESD also occurs prior to forming of the source metal layer. The inventor has found that a leakage occurs in the gate insulating layer in a case that the source electrode or the drain electrode is formed on the gate insulating layer being damaged or deteriorated by the ESD in this way.

The above-mentioned occurrence of the ESD is believed to be also related to the formation of the gate driver onto the display panel. In other words, in a case of such a structure, the function of the display panel is greatly impaired as described previously in the event that the gate driver fails, so that the gate insulating layer is formed by undergoing a layer forming process multiple times, for example, to surely insulate the gate metal layer and the source metal layer. However, it is believed that each of the conductor patterns of the gate metal layer is charged more by undergoing the multiple times of the layer forming process. Moreover, in a case that the ESD occurs prior to the final layer forming process of the multiple times of the layer forming processes, it is difficult to form a normal insulating layer thereafter even if the layer forming is repeated at the location at which the ESD occurs.

Furthermore, the inventor has further studied the trend of occurrence of the ESD and found that the ESD is likely to occur in between conductor patterns having a large area. This is believed to be caused by a fact that the larger the area is, the more electric charges can be accumulated in each of the conductor patterns. For example, a gate line or a source line to be connected to all the pixel drive circuits being lined up in one row or one column in a matrix arrangement can be formed in the gate metal layer. In addition, a conductor pattern (below-described trunk line pattern) being long and preferably having a large width, which transmits an external signal being common to all the rows or columns of the pixels arranged in a matrix, can also be formed in the gate metal layer. It has been confirmed that the ESD is likely to occur in between two conductor patterns being long and, therefore, having a large area in this way, for example.

Then, the inventor has found that the display panel can be made function normally, even in a case that the ESD occurs, by appropriately forming two conductor patterns in which discharging such as the ESD could occur in a metal layer to be formed prior to forming of the gate insulating layer. For example, in order to cause discharging to occur at a portion in a metal layer to be formed prior to the gate insulating layer, a discharge portion is provided to a conductor pattern of the relevant metal layer, the portion being different from a portion at which conductor patterns, such as the gate electrode and the source electrode, respectively formed in two metal layers overlap with each other. In this way, even when the ESD occurs in the discharge portion, for example, the thin-film transistor, the drive circuit, and the display panel can be made function normally.

Below, a display panel and a method for manufacturing display panel according to embodiments of the present invention are described with reference to the drawings. Material and shape of each of constituting elements and relative positional relationships thereof according to the below-described embodiments are merely exemplary, so that the display panel and the method for manufacturing display panel according to the present invention are construed to be not limited thereby.

[Structure of Display Panel]

FIG. 1 schematically shows one example of the configuration of a display panel 1 according to embodiment 1. As shown in FIG. 1, the display panel 1 comprises: a plurality of pixels 3 being formed in a matrix arrangement on a surface of a substrate 10 (an array substrate); and one or more drive circuits 2 to supply a signal to one or a plurality of pixels 3 being lined up in the same row or the same column in the plurality of pixels 3. An image display portion 30 of the display panel 1 is configured by the plurality of pixels 3 and the drive circuit 2 is formed outside the image display portion 30 on the surface of the substrate 10. In the example in FIG. 1, the drive circuit 2 is connected to each of the plurality of pixels 3 being lined up in the same row (each row being parallel to the X direction being the left-right direction in FIG. 1) and supplies a gate signal substantially simultaneously to these pixels 3 being lined up in the same row. Moreover, in the example in FIG. 1, the drive circuit 2 is provided in a plurality, and the plurality of drive circuits 2 successively supply the gate signal for each of the rows of the pixels 3 being arranged in the matrix. In other words, the drive circuit 2 in FIG. 1 is an example of a drive circuit to function as a so-called gate driver (scan driver), and each of the drive circuits 2 functions as the gate driver of one stage corresponding to each of the rows of the pixels being arranged in the matrix. In the example in FIG. 1, a common wiring 20 to input a predetermined signal to each of the one or more drive circuits 2 is provided at the edge of the substrate 10 and is connected to each of the drive circuits 2. In FIG. 1, a drive circuit 2s being provided at the exterior of the display panel 1 to function as a so-called source driver to supply a source signal for each of the columns of the plurality of pixels 3 is also shown together.

Each one of the plurality of pixels 3 comprises a pixel drive circuit 3a to switch the emission state of light from the pixels 3. The drive circuit 2 (below, to make the distinction with respect to the pixel drive circuit 3a clear, the drive circuit 2 in the example to function as the gate driver is also denoted as a gate driver 2) is connected to the pixel drive circuit 3a of each of the pixels 3. In the example in FIG. 1, the pixel drive circuit 3a is configured by a thin-film transistor (TFT) 31 and an auxiliary capacitance 3b, and the gate driver 2 is connected to the gate of the TFT 31 via a gate line. The source of the TFT 31 is connected to an external source driver (the drive circuit 2s) via a source line, while the drain of the TFT 31 is connected to a pixel electrode being provided in a liquid crystal layer LC for each of the pixels 3 and also connected to the auxiliary capacitance 3b. In other words, FIG. 1 shows an example in which the display panel 1 is a liquid crystal display panel. The display panel according to the present embodiment can be an active matrix-type display panel being other than the liquid crystal display panel, so that it can be an organic-EL display panel, for example. Moreover, the drive circuit in the display panel according to the present embodiment can supply the gate signal substantially simultaneously to a plurality of pixels 3 being lined up in the same column (each column being parallel to the Y direction being the up-down direction in FIG. 1), not in the same row.

Figure 2:
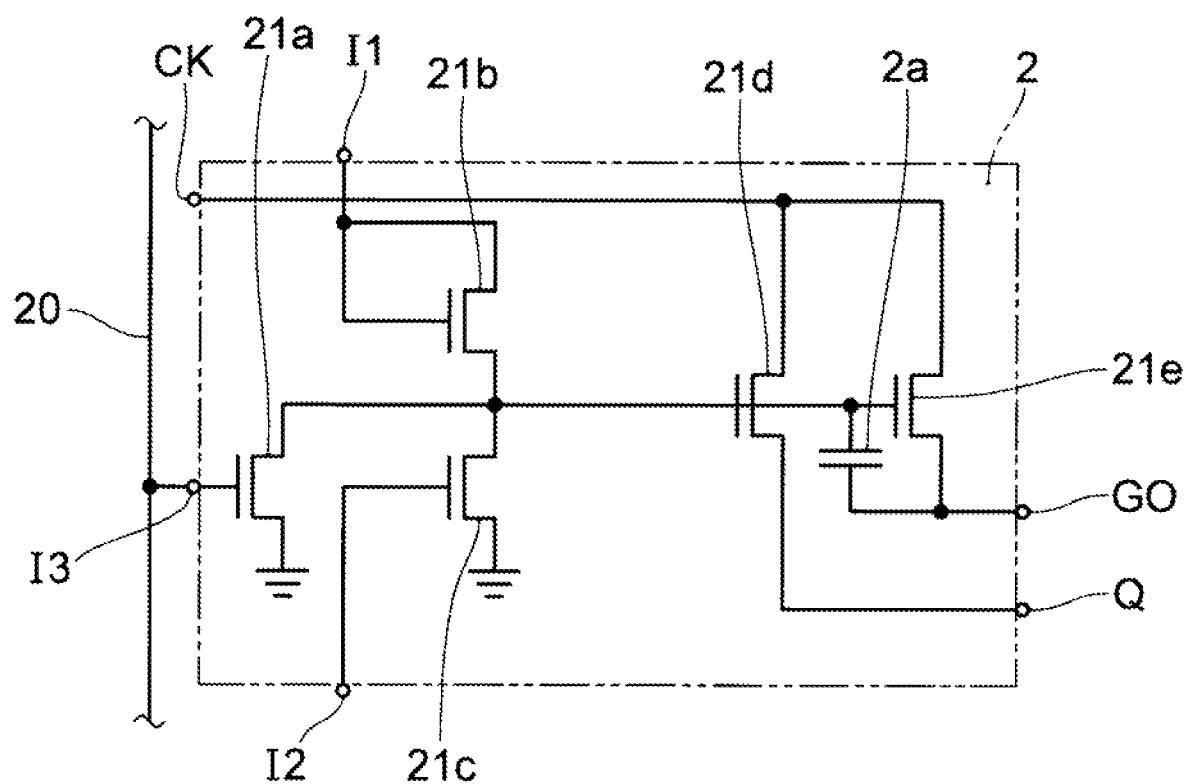
FIG. 2 shows, in a simplified manner, a circuit diagram of one example of a drive circuit in the display panel according to embodiment 1.

FIG. 2 shows a circuit diagram of one example of the drive circuit 2 to function as the gate driver. In FIG. 2, a part of a circuit element configuring the drive circuit 2 is omitted as needed. In the example in FIG. 2, the drive circuit 2 comprises five TFTs (a TFT 21a to a TFT 21e) and a capacitor 2a. A clock is input to an input CK, and a gate signal is output from an output GO. As in the example in FIG. 1, in a case that the plurality of drive circuits 2 are formed such that each thereof corresponds to each of the rows (each stage) of the pixels, inputs I1 and I2, and an output Q can be connected to the drive circuit 2 in a different stage. For example, the drive circuit 2 outputs, from the output GO, a gate signal to cause light to be emitted from the pixels 3 based on a signal input from the input CK and the input I1 and outputs, to the drive circuit 2 in the different stage, a signal having the same logic level as the output GO from the output Q. Moreover, the drive circuit 2 outputs, from the output GO, a gate signal to not cause light to be emitted from the pixels 3 in accordance with a signal input from the input I2, for example. Furthermore, the drive circuit 2 in the example in FIG. 2 comprises an input I3, which is connected to the common wiring 20, and electric charges being accumulated in the capacitor 2a can be discharged in accordance with a signal input to the input I3.

Figure 3:
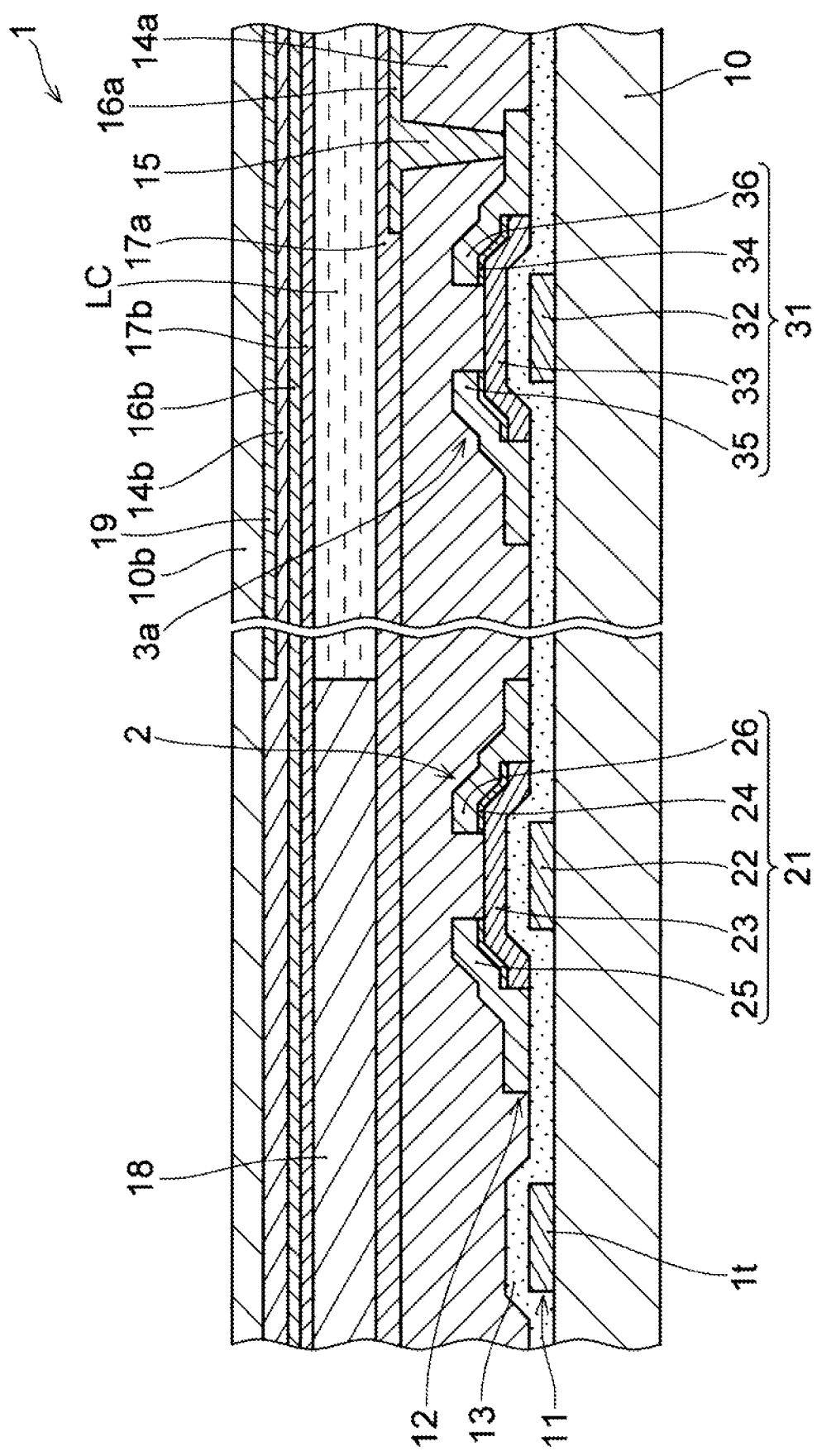
FIG. 3 shows one example of a cross section of the display panel according to embodiment 1.

FIG. 3 shows one example of a partial cross section of the display panel 1 and mainly shows a TFT 21 of the drive circuit 2 (the gate driver) being formed on the substrate 10 and the TFT 31 of the pixel drive circuit 3a. As FIG. 3 exemplifies the display panel 1 being the liquid crystal display panel in the same manner as in FIG. 1, the liquid crystal layer LC is provided on the pixel drive circuit 3a. As shown in FIG. 3, the display panel 1 is formed on the surface of the substrate 10 and comprises a first conductor layer 11 comprising gate electrodes 22, 32 of the TFT 21 and the TFT 31. In other words, the first conductor layer 11 in the example in FIG. 3 is a gate metal layer. The first conductor layer 11 also comprises a trunk line pattern 1t configuring the common wiring 20 (see FIG. 1). The display panel 1 comprises an insulating layer 13 being formed on the entire surface of the substrate 10 to cover the first conductor layer 11 and comprising a portion to function as a gate insulating layer in each of the TFT 21 and the TFT 31. Moreover, the display panel 1 comprises, on the insulating layer 13, a second conductor layer 12 comprising a source electrode 25 and a drain electrode 26 of the TFT 21 and a source electrode 35 and a drain electrode 36 of the TFT 31. In other words, the second conductor layer 12 in the example in FIG. 3 is a source metal layer.

The TFT 21 and the TFT 31 being exemplified in FIG. 3 are bottom gate-type thin-film transistors and comprise, on the gate electrodes 22, 32, semiconductor layers 23, 33, respectively, via a gate insulating layer being configured by a part of the insulating layer 13. The first conductor layer 11 is formed using tungsten, molybdenum, titanium, aluminum, or a copper-titanium alloy, for example. As the insulating layer 13, a silicon oxide film ($SiO_2$) or a silicon nitride film ($SiN_x$) is exemplified. The semiconductor layers 22, 33 are formed using amorphous silicon, low-temperature polycrystalline silicon (LTPS), or a mixed crystal semiconductor, for example. Contact layers 24, 34 are formed, on the semiconductor layers 23, 33, with a semiconductor having a high impurities concentration, while the source electrodes 25, 35 and the drain electrodes 26, 36 are formed on the contact layers 24, 34 and on a part of the insulating layer 13. The second conductor layer 12 comprising each of the source electrodes and each of the drain electrodes is formed with the same material as the first conductor layer 11, for example.

A planarizing layer 14a covering the pixel drive circuit 3a comprising the TFT 31 is formed, and a pixel electrode 16a is formed on the surface of the planarizing layer 14a. The pixel electrode 16a is connected to the drain electrode 36 via a contact conductor 15 being formed in the planarizing layer 14a. A first alignment layer 17a is formed on the planarizing layer 14a and the pixel electrode 16a, and the liquid crystal layer LC is formed by injecting a nematic liquid crystal in between the first alignment layer 17a and a second alignment layer 17b. The second alignment layer 17b is deposited together with a color filter 19, a planarizing layer 14b, and a counter electrode 16b on a surface of a counter substrate 10b, the surface facing the substrate 10, and the counter substrate 10b being arranged to face the substrate 10 with the pixel drive circuit 3a being sandwiched between the counter substrate 10b and the substrate 10. The counter substrate 10b is arranged at a predetermined interval between the counter substrate 10b and the substrate 10 via a spacer 18. Moreover, while not shown, a polarizer can be provided on a surface, of each of the substrate 10 and the counter substrate 10b, being oriented in a direction opposite to the liquid crystal layer LC, and, in a case that the display panel 1 is a transmissive-type liquid crystal display panel, a light source configured by an LED, or a light guide plate (both not shown) is provided, so as to face the polarizer being provided at the substrate 10. Each of the constituting elements above the pixel drive circuit 3a, such as the pixel electrode 16a, the first and second alignment layers 17a, 17b, and the liquid crystal layer LC, can have a general structure, so that detailed explanations thereof will be omitted. In a case that the display panel 1 is an organic-EL display panel, an organic light-emitting element is formed for each of the pixels 3 in replacement of the liquid crystal layer LC.

Figure 4B:
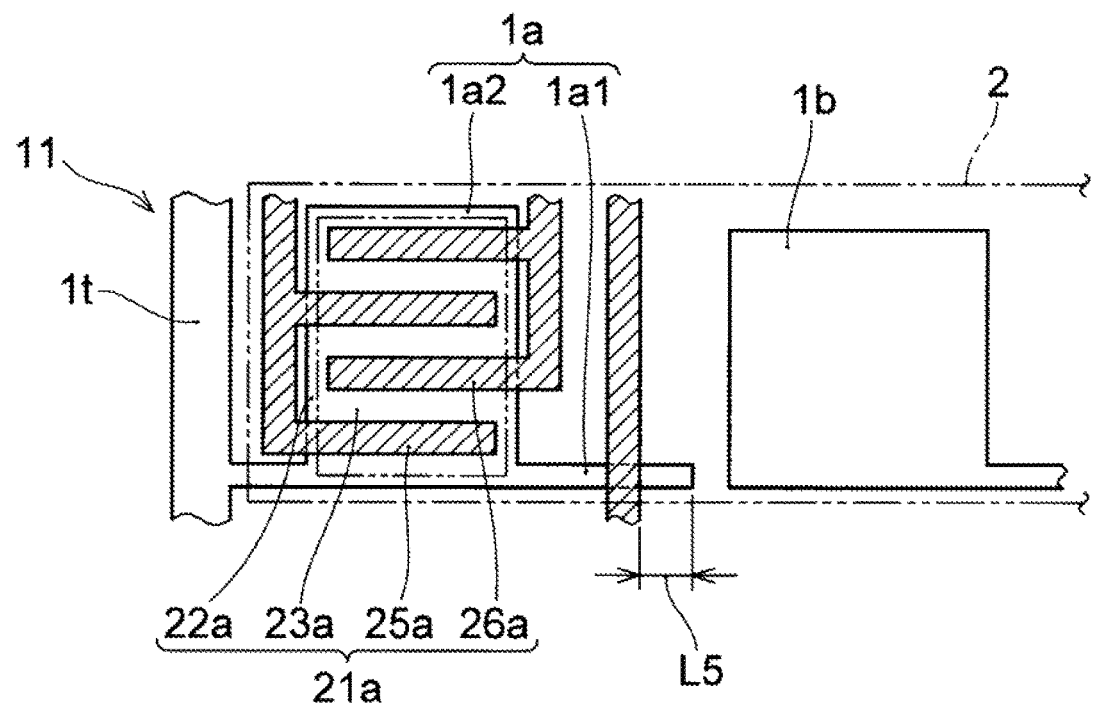
FIG. 4B shows a plan view of a different example of the discharge portion in the display panel according to embodiment 1.
Figure 4C:
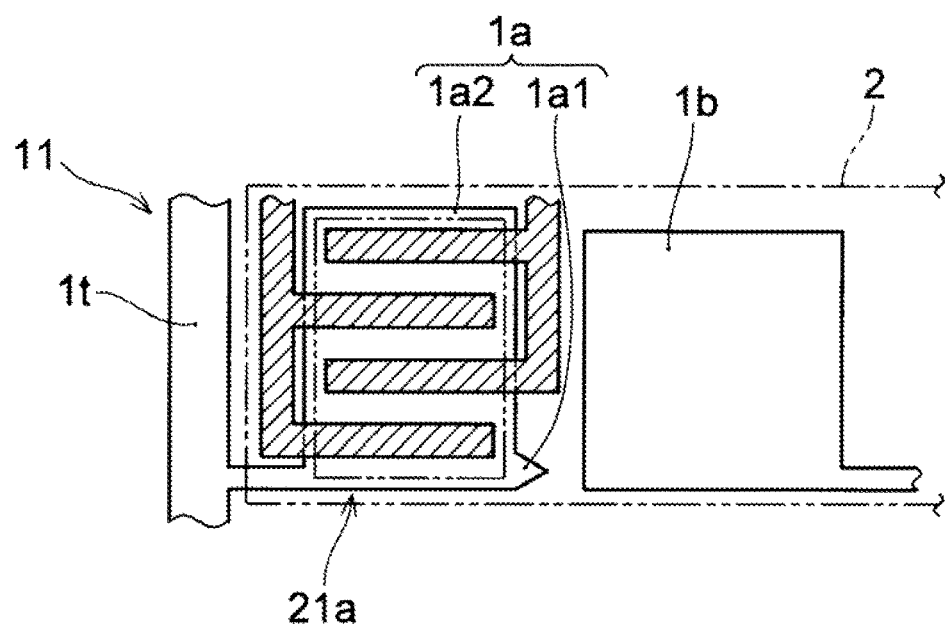
FIG. 4C shows a plan view of a different example of the discharge portion in the display panel according to embodiment 1.

The first conductor layer 11 can comprise a plurality of conductor patterns, each one of which has an arbitrary shape, configuring a part of the drive circuit 2 and a part of the pixel drive circuit 3 and being electrically separated from each other. For example, the first conductor layer 11 can comprise a plurality of conductor patterns configuring the gate electrodes 22, 32 of the TFT 21 and the TFT 31 described previously, or the capacitor 2a (see FIG. 2) or the auxiliary capacitance 3b (see FIG. 1), or comprising a portion configuring them. In FIGS. 4A to 4C, a first conductor pattern 1a and a second conductor pattern 1b, each of which configures a part of the drive circuit 2, are shown as examples of the plurality of conductor patterns. The first conductor pattern 1a and the second conductor pattern 1b are two conductor patterns being electrically separated from each other in the first conductor layer 11. In other words, the first conductor pattern 1a and the second conductor pattern 1b are electrically separated mutually as long as a conductor layer other than the first conductor layer 11 does not intermediate between the first conductor pattern 1a and the second conductor pattern 1b.

As shown in FIGS. 4A to 4C, each of the first conductor pattern 1a and the second conductor pattern 1b comprises a first element forming portion 1a2 or a second element forming portion 1b2 configuring a part of a circuit element configuring any of the one or more drive circuits 2. In the example shown in FIG. 4A, the first conductor pattern 1a comprises a first element forming portion 1a2 configuring a part of the TFT 21a being a first circuit element configuring the drive circuit 2, while the second conductor pattern 1b comprises a second element forming portion 1b2 configuring a part of the TFT 21b being a second circuit element configuring the drive circuit 2. In the examples shown in FIGS. 4B and 4C, only the first conductor pattern 1a comprises the first element forming portion 1a2. Unlike the examples in FIGS. 4A to 4C, only the second conductor pattern 1b can comprise the second element forming portion 1b2.

The first element forming portion 1a2 configures a gate electrode 22a of the TFT 21a, while the second element forming portion 1b2 configures a gate electrode 22b of the TFT 21b. In FIGS. 4A to 4C, the insulating layer 13 (see FIG. 3) is omitted, and the first and second conductor patterns 1a, 1b being included in the first conductor layer 11 are drawn in a solid line. The TFT 21a shown in FIGS. 4A to 4C comprises the gate electrode 22a, a gate insulating layer (not shown) being a part of the insulating layer 13 to cover the gate electrode 22a, a semiconductor layer 23a being formed on the gate insulating layer, and a source electrode 25a and a drain electrode 26a being formed on the gate insulating layer and the semiconductor layer 23a. The TFT 21b shown in FIG. 4A also comprises the deposition structure similar to that of the TFT 21a and comprises the gate electrode 22b, a gate insulating layer (not shown), a semiconductor layer 23b, and a source electrode 25b and a drain electrode 26b. The semiconductor layers 23a, 23b are drawn in chain double-dashed lines to distinguish them from the first and second conductor patterns 1a, 1b.

The source electrodes 25a, 25b, and the drain electrodes 26a, 26b are formed in the previously-described second conductor layer 12 (the source metal layer). The source electrodes 25a, 25b, and the drain electrodes 26a, 26b are hatched to distinguish them from the first and second conductor patterns 1a, 1b in FIGS. 4A to 4C. In the source electrodes 25a, 25b and the drain electrodes 26a, 26b, each of which has a comb-like planar shape, a recess and a projection of each of the source electrodes 25a, 25b and a projection and a recess of each of the drain electrodes 26a, 26b are combined. A channel having a large channel width can be formed in each of the TFTs 21a, 21b.

While the second conductor pattern 1b can be formed merely as a wiring in the drive circuit 2 in the examples in FIGS. 4B and 4C, one electrode of the capacitor 2a shown in FIG. 2 as previously referred to can be configured by the second conductor pattern 1b, for example.

In the present embodiment, as shown in FIGS. 4A to 4C, discharge portions 1a1, 1b1 are provided to at least one of the first conductor pattern 1a and the second conductor pattern 1b. In the example in FIG. 4A, the discharge portion 1a1 is provided to the first conductor pattern 1a, and the discharge portion 1b1 is provided to the second conductor pattern 1b. In the examples in FIGS. 4B and 4C, the discharge portion 1a1 is provided only to the first conductor pattern 1a. Unlike the examples in FIGS. 4A to 4C, the discharge portion 1b1 can be provided only to the second conductor pattern 1b. The discharge portions 1a1, 1b1 are provided so as to partially narrow the interval between the first conductor pattern 1a and the second conductor pattern 1b. Specifically, the discharge portions 1a1, 1b1 are provided so as to make the interval between the first conductor pattern 1a and the second conductor pattern 1b at each of the discharge portions 1*a*1, 1*b*1 narrower than the interval between the first element forming portion 1*a*2 and the second element forming portion 1*b*2.

By providing the discharge portions 1*a*1, 1*b*1 in this way, it is possible to avoid an occurrence of an ESD in the first and second element forming portions 1*a*2, 1*b*2 or in portions in immediate proximity thereto. In other words, the ESD that can occur between the first conductor pattern 1*a* and the second conductor pattern 1*b* when the first conductor layer 11 is charged almost never occurs between the first element forming portion 1*a*2 and the second conductor pattern 1*b* or between the second element forming portion 1*b*2 and the first conductor pattern 1*a*. Such an ESD occurs between the discharge portion 1*a*1 and a portion (for example, the discharge portion 1*b*1) being other than the second element forming portion 1*b*2 in the second conductor pattern 1*b*, or between the discharge portion 1*b*1 and a portion (for example, the discharge portion 1*a*1) being other than the first element forming portion 1*a*2 in the first conductor pattern 1*a*. Therefore, normal formation of the gate insulating layer to be configured by a part of the insulating layer 13 at the first and second element forming portions 1*a*2, 1*b*2 is not hindered and, moreover, a gate insulating layer being already formed is not damaged. Alternatively, in a case where the first element forming portion 1*a*2 or the second element forming portion 1*b*2 configures one of electrodes of the capacitor 2*a* (see FIG. 2) and another of the electrodes thereof is formed in the second conductor layer 12 (see FIG. 3), it is also possible to prevent functions of the capacitor 2*a* from being impaired as a result of the damage of a dielectric body (the insulating layer 13) between the electrodes due to the ESD. Therefore, damaging of the drive circuit 2 in such a manner as to hinder displaying of an image can be avoided.

The discharge portions 1*a*1, 1*b*1 are provided so as to make the interval between the first conductor pattern 1*a* and the second conductor pattern 1*b* partially smaller so that discharging between the first conductor pattern 1*a* and the second conductor pattern 1*b* is more likely to occur at the discharge portions 1*a*1, 1*b*1. However, at the discharge portions 1*a*1, 1*b*1, discharging does not necessarily have to occur, so that, for example, discharging does not occur at the discharge portions 1*a*1, 1*b*1 as long as the first conductor layer 11 is not charged to such a degree that the ESD occurs. As described previously, the discharge portions 1*a*1, 1*b*1 can be adequate as long as the discharge portions 1*a*1, 1*b*1 are provided so as to make the interval between the first conductor pattern 1*a* and the second conductor pattern 1*b* at the discharge portions 1*a*1, 1*b*1 narrower than the interval between the first conductor pattern 1*a* and the second conductor pattern 1*b* at the first and second element forming portions 1*a*2, 1*b*2.

The "conductor pattern", such as the first conductor pattern 1*a* and the second conductor pattern 1*b*, means a singular conductor film being electrically and spatially separated from electrical conductors in the surrounding of the singular conductor film in a region of the first conductor layer 11 or the second conductor layer 12, in which region the drive circuit 2 is formed. Moreover, the "conductor pattern", such as the first conductor pattern 1*a* and the second conductor pattern 1*b* can comprise an arbitrary conductor pattern, such as a trunk line pattern 1*t* as described below, to be formed outside a forming region of the drive circuit 2.

In the example in FIG. 4A, the discharge portion 1*a*1 being provided to the first conductor pattern 1*a* projects toward the second conductor pattern 1*b* from a first outer edge 1*a*4 of the first element forming portion 1*a*2, the first outer edge 1*a*4 being an edge toward the second conductor pattern 1*b*. Moreover, the discharge portion 1*b*1 being provided to the second conductor pattern 1*b* projects toward the first conductor pattern 1*a* from a second outer edge 1*b*4 of the second element forming portion 1*b*2, the second outer edge 1*b*4 being an edge toward the first conductor pattern 1*a*. In one of the first conductor pattern 1*a* and the second conductor pattern 1*b*, the discharge portion 1*a*1 or the discharge portion 1*b*1 projecting toward another of the first conductor pattern 1*a* and the second conductor pattern 1*b* is provided in this way. The discharge portion 1*a*1 is adjacent to the first element forming portion 1*a*2. Moreover, the discharge portion 1*b*1 is adjacent to the second element forming portion 1*b*2. Then, the tip of the discharge portion 1*a*1 and the tip of the discharge portion 1*b*1 face each other.

When the first conductor layer 11 is charged in a case that the discharge portions 1*a*1, 1*b*1 are not provided to the TFT 21*a* and the TFT 21*b* being formed as with the example in FIG. 4A, the ESD can occur at an arbitrary position of the first element forming portion 1*a*2 and the second element forming portion 1*b*2 facing each other. For example, in a portion in which the source electrode 25*a* and the first element forming portion 1*a*2 overlap, a gate insulating layer (not shown) being interposed between the source electrode 25*a* and the first element forming portion 1*a*2 can also be damaged. However, the ESD occurs between the discharge portion 1*a*1 and the discharge portion 1*b*1 in a case that the discharge portions 1*a*1, 1*b*1 are provided as in the example in FIG. 4A, so that an effect on the gate insulating layer (not shown) is also limited to the surrounding of the discharge portions 1*a*1, 1*b*1. Therefore, by providing the discharge portions 1*a*1, 1*b*1 at positions in which the ESD does not affect the first element forming portion 1*a*2 and/or the second element forming portion 1*b*2, it is possible to cause the drive circuit 2 to function normally.

The shorter the interval between the first conductor pattern 1*a* and the second conductor pattern 1*b* at the discharge portions 1*a*1, 1*a*2 (the interval between the discharge portion 1*a*1 and the discharge portion 1*a*2 in FIG. 4A) is, the more preferable it is since the ESD can more surely be induced at the discharge portions 1*a*1, 1*b*1. For example, the discharge portion 1*a*1 and the discharge portion 1*b*1 can be provided with a minimum interval therebetween with which a withstand voltage between the first conductor pattern 1*a* and the second conductor pattern 1*b* to be set for the normal usage environment can be secured.

The range in which discharging at the discharge portions 1*a*1, 1*b*1 affects the gate insulating layer varies in accordance with the charge amount of the first conductor pattern 1*a* and the second conductor pattern 1*b* at the time of discharging at the discharge portions 1*a*1, 1*b*1 and the interval between the discharge portion 1*a*1 and the discharge portion 1*b*1. Generally, the longer the discharge distance is, the greater the electric potential difference between two conductors at the time of discharging becomes. Thus, it is believed that the shorter the interval between the first conductor pattern 1*a* and the second conductor pattern 1*b* at the discharge portions 1*a*1, 1*b*1 is, the smaller the electric potential difference between both the conductor patterns at the time of discharging becomes. Therefore, it is believed that the shorter the interval between the first conductor pattern 1*a* and the second conductor pattern 1*b* at the discharge portions 1*a*1, 1*b*1 is, also the smaller the range in which the insulating layer 13 (see FIG. 3) is affected becomes. Preferably, a projection length L1 of the discharge portion 1*a*1 projecting from an adjacent portion (the first element forming portion 1*a*2 in the example in FIG. 4A) in the first conductor pattern 1a is longer than an interval G between the first conductor pattern 1a and the second conductor pattern 1b at the discharge portion 1a1. Moreover, preferably, a projection length L2 of the discharge portion 1b1 projecting from an adjacent portion (the second element forming portion 1b2 in the example in FIG. 4A) in the second conductor pattern 1b is longer than the interval G. In this way, it can be possible to confine an effect on the insulating layer 13 due to the ESD that can occur in the discharge portions 1a1, 1b1 to a range in which the first and second element forming portions 1a2, 1b2 are not affected and to avoid the ESD affecting the circuit element configuring the drive circuit 2.

Moreover, as described previously, the charging amount of the first conductor layer 11 varies in accordance with the area of a conductor pattern included in the first conductor layer 11. As described below, the first conductor layer 11 can also comprise conductor patterns extending to the image display portion 30 (see FIG. 1) to be connected to each of the pixel drive circuits 3a (see FIG. 1) being lined up in one column. Therefore, the charge amount of the first conductor layer 11 can vary in accordance with the screen size of the display panel 1.

For example, in a case of a display panel having a 60-inch screen size, the interval G between the first conductor pattern 1a and the second conductor pattern 1b at the discharge portions 1a1, 1b1 is preferably less than or equal to 12 μm. This is because the inventor has made a confirmation that providing the discharging portions 1a1, 1b1 at the interval of 12 μm in the drive circuit 2 of the 60-inch liquid crystal display panel can induce the ESD as intended at the discharge portions 1a1, 1b1 and can prevent damaging of the drive circuit 2. At the time of this confirmation, it has also been confirmed that the range in which the ESD occurring at the discharging portions 1a1, 1b1 affects the insulating layer 13 (see FIG. 3) is a range of 20 μm along the projecting direction of the discharge portion 1a1, 1b1. Therefore, the lengths L1, L2 of the discharge portions 1a1, 1b1 are preferably greater than or equal to 20 μm. The minimum dimension of the interval G is the minimum interval that can be realized in the patterning process to form the discharge portions 1a1, 1b1, for example.

Even when the lengths L1, L2 of the discharge portions 1a1, 1b1 are less than the length as described above, it is believed that no substantial problem arises as long as the location at which a conductor pattern of the first conductor layer 11 and a conductor pattern of the second conductor layer 12 overlap with each other is outside a range in which the influence of the ESD at the discharge portions 1a1, 1a2 is received. For example, the lengths (for example, lengths L3, L4 shown in FIG. 4A) from the tip of the discharge portions 1a1, 1b1 to the most proximate portion in which the conductor pattern of the first conductor layer 11 and the conductor pattern of the second conductor layer 12 overlap can be greater than or equal to 20 μm.

As previously described, more electric charges can be charged to a conductor pattern having a larger area in the first conductor layer 1. Therefore, the first conductor pattern 1a to which the discharge portion 1a1 can be provided or the second conductor pattern 1b to which the discharge portion 1b1 can be provided can have the largest area in a plurality of conductor patterns each one of which is included at least partially in a region of the first conductor layer 11, in which region the drive circuit 2 is formed. In that case, a circuit element being believed to have a high risk of being broken by the ESD can be protected.

In the examples in FIGS. 4A to 4C, the first conductor pattern 1a comprises the trunk line pattern 1t configuring the common wiring 20 shown in FIG. 1 as referred to previously. The first element forming portion 1a2 is directly connected to the trunk line pattern 1t. The "directly" means connecting without interposing the other circuit element forming portions. As the common wiring 20 shown in FIG. 1, the trunk line pattern 1t can be formed, along one side of the display panel 1 having a planar shape being substantially rectangular, over substantially the entire length of the one side thereof. Therefore, the trunk line pattern 1t can have a relatively large area among the conductor patterns being formed in the forming region of the drive circuit 2 in the first conductor layer 11. The first conductor pattern 1a comprises the trunk line pattern 1t and, therefore, can configure a conductor pattern having the largest area among the conductor patterns each being included at least partially in the forming region of the drive circuit 2. The discharge portion 1a1 being provided to the first conductor pattern 1a as such makes it possible to protect a circuit element having a high risk of being broken by the ESD. The second conductor pattern 1b, not the first conductor pattern 1a, can comprise the trunk line pattern 1t, in which case the second element forming portion 1b2 can be directly connected to the trunk line pattern 1t.

In the example in FIG. 4B, the discharge portion 1a1 is provided only to the first conductor pattern 1a. By providing the discharge portion 1a1 only to the first conductor pattern 1a in this way, it is possible to further separate the first element forming portion 1a2 and the tip of the discharge portion 1a1 while maintaining the withstand voltage required at the time of normal usage between the first conductor pattern 1a and the second conductor pattern 1b. Moreover, in the example in FIG. 4B, no element forming portion is provided to the second conductor pattern 1b at a position facing the first conductor pattern 1a, so that no problem arises in particular even when the tip of the discharge portion 1a1 is brought closer to the immediate proximity of the second conductor pattern 1b.

In the example in FIG. 4B, a wiring pattern 12a is formed in the second conductor layer 12 (see FIG. 3) comprising the source electrode 25a. The wiring pattern 12a partially overlaps the discharge portion 1a1 with the insulating layer 13 (see FIG. 3) being sandwiched between the wiring pattern 12a and the discharge portion 1a1. In this case, a portion in which the wiring pattern 12a and the discharge portion 1a1 overlap is preferably positioned outside a range being affected by the ESD at the discharge portion 1a1. In other words, a length L5 from the tip of the discharge portion 1a1 to the portion in which the wiring pattern 12a and the discharge portion 1a1 overlap is preferably greater than or equal to 20 μm.

In the example in FIG. 4C, in the same manner as the example in FIG. 4B, the discharge portion 1a1 is provided only to the first conductor pattern 1a. The discharge portion 1a1 in the example in FIG. 4C does not comprise a portion extending, as in the examples in FIGS. 4A and 4B, with a certain width toward the second conductor pattern 1b. Even if the discharge portion 1a1 does not comprise such a portion, as described previously, as long as the location at which the conductor pattern of the first conductor layer 11 and the conductor pattern of the second conductor layer 12 overlap is outside a range being affected by the ESD at the discharge portion 1a1, no problem occurs in particular, and it is possible to prevent breakage of the circuit element configuring the drive circuit 2.

The discharge portion 1a1 in the example in FIG. 4C projects in a shape being tapered toward the second conductor pattern 1b from the edge of the first element forming portion 1a2 and has a shape of a triangle having a vertex being oriented to the second conductor pattern 1b. Discharging is likely to occur when the tip of the discharge portion 1a1 (and/or the discharge portion 1b1 in FIG. 4A) is pointed in this way, so that discharging occurring at a portion other than the discharge portions 1a1, 1b1 can be prevented more surely.

Figure 5:
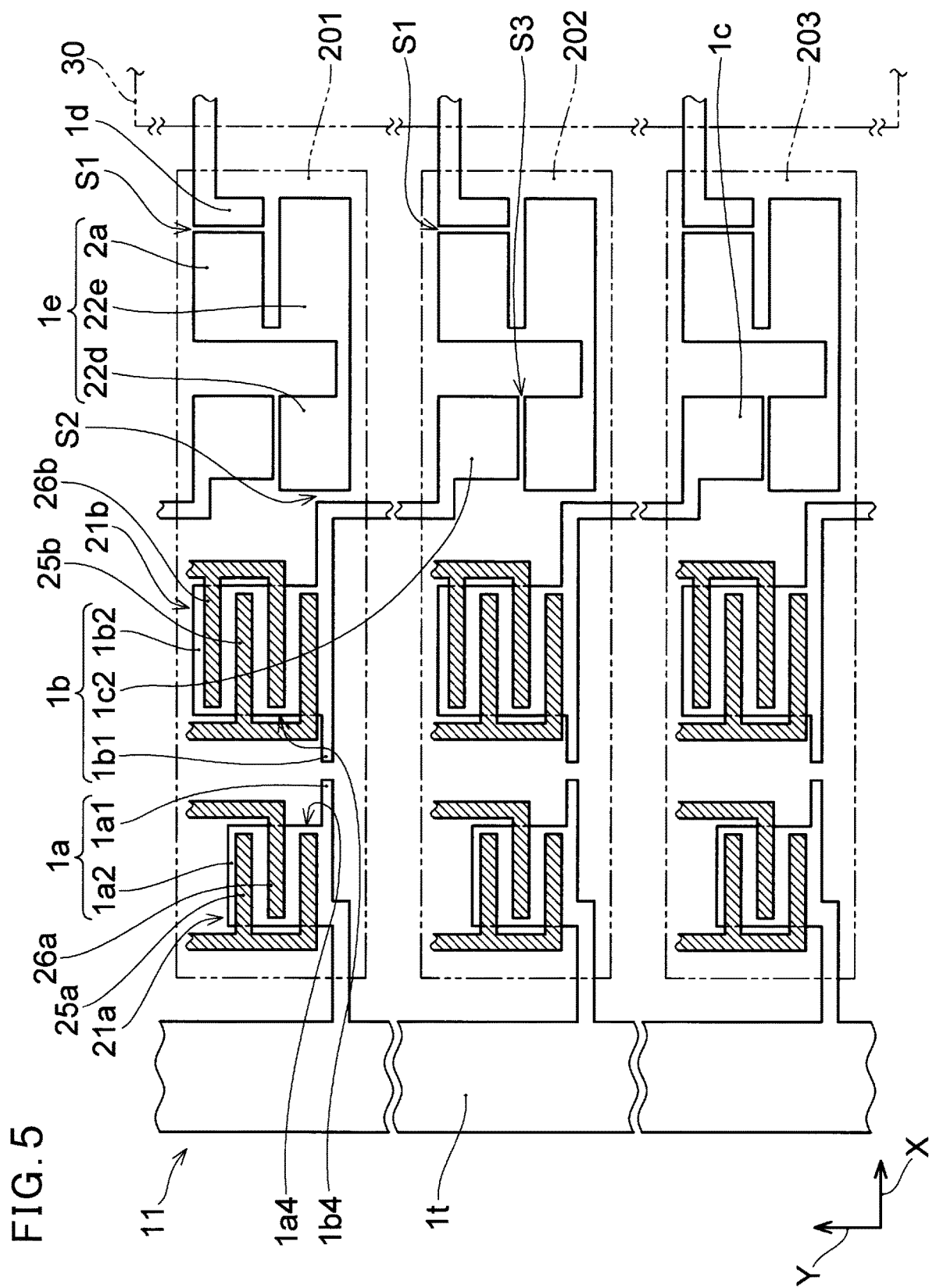
FIG. 5 schematically shows a plan view of an example of a conductor pattern configuring each of a plurality of drive circuits in the display panel according to embodiment 1.

FIG. 5 shows an example of a plurality of conductor patterns of the first conductor layer 11, the plurality of conductor patterns configuring each one of a plurality of drive circuits (a first drive circuit 201, a second drive circuit 202, and a third drive circuit 203) according to the present embodiment. The plurality of conductor patterns comprises the previously-described first conductor pattern 1a and second conductor pattern 1b, and fourth and fifth conductor patterns 1d, 1e for each region in which each of the drive circuits is formed. Each of the conductor patterns configures a part of each drive circuit in each one of the plurality of drive circuits (the first to the third drive circuits 201 to 203). Moreover, in the same manner as the examples in FIGS. 4a to 4C, the first conductor pattern 1a comprises the trunk line pattern 1t. The trunk line pattern 1t is provided at the edge of the substrate 10 (see FIGS. 1 and 3) along a direction in which the plurality of drive circuits (the first to the third drive circuits 201 to 203) are lined up. While the first to third drive circuits 201 to 203 are shown in FIG. 5, an arbitrary number of drive circuits can be provided in the present embodiment.

In each of the first to third drive circuits 201 to 203, the first conductor pattern 1a comprises the first element forming portion 1a2 configuring the gate electrode of the TFT 21a shown in FIG. 2, and the discharge portion 1a1, and the second conductor pattern 1b comprises the second element forming portion 1b2 configuring the gate electrode of the TFT 21b shown in FIG. 2, and the discharge portion 1b1. The discharge portions 1a1, 1b1 are provided in each of the plurality of drive circuits (the first to third drive circuits 201 to 203). Therefore, damaging due to the ESD is prevented in any of the first to third drive circuits 201 to 203.

The second conductor pattern 1b extends over one (for example, the first drive circuit 201) of the one or more drive circuits 201 to 203 and another drive circuit (for example, the second drive circuit 202) being different from the one drive circuit. The second circuit element (the TFT 21b), a part of which is configured by the second element forming portion 1b2 of the second conductor pattern 1b, is a circuit element of the one drive circuit (the first drive circuit 201). Then, the second conductor pattern 1b further comprises a third element forming portion 1c2 configuring a part of the third circuit element (the TFT 21c in FIG. 2) configuring another drive circuit (the second drive circuit 202). A fourth conductor pattern 1d extends toward the image display portion 30 from each of the first to third drive circuits 201 to 203 and are connected to the pixel drive circuits 3a (see FIG. 1) provided to each of the plurality of pixels 3 (see FIG. 1). Moreover, a fifth conductor pattern 1e configures the gate electrodes 22d, 22e of the TFT 21d and the TFT 21e, respectively, and one electrode of the capacitor 2a that are shown in FIG. 2, for example.

The TFT 21a comprises the source electrode 25a and the drain electrode 26a being formed in the second conductor layer 12 (see FIG. 3) and the TFT 21b comprises the source electrode 25b and the drain electrode 26b. In FIG. 5, the semiconductor layers 23a, 23b (see FIG. 4A), a third element forming portion 1c2, and conductor patterns (the source electrode and the drain electrode of each TFT) of the second conductor layer 12 to be overlapped to the fourth and fifth conductor patterns 1d, 1e are omitted. The insulating layer 13 (see FIG. 3) comprising the gate insulating layer is also omitted in the same manner as in FIGS. 4A to 4C.

In the example in FIG. 5, the first conductor pattern 1a in each one of the plurality of drive circuits (the first to third drive circuits) shares the trunk line pattern 1t. As previously described, the trunk line pattern 1t that can have a large area is likely to be charged to a high degree. Therefore, in the first conductor pattern 1a, the ESD is likely to occur between the first conductor pattern 1a and the second conductor pattern 1b. However, the discharge portion 1a1 is provided to the first conductor pattern 1a, making it possible to prevent breakage of a circuit element, a part of which is configured by the first element forming portion 1a2. In other words, a circuit element having a high risk of being broken by ESD can be protected effectively.

Moreover, in the example in FIG. 5, as described previously, the second conductor pattern 1b in the first drive circuit 201 comprises the third element forming portion 1c2 configuring a part of the second drive circuit 202 being different from the first drive circuit 201. A connection between the second drive circuit 202 and the third drive circuit 203 is also similarly made by the second conductor pattern 1b in the second drive circuit 202. Therefore, electric charges being charged in the third element forming portion 1c2 can be discharged without providing a discharge portion to the third element forming portion 1c2. For example, electric charges being charged in the third element forming portion 1c2 of the second drive circuit 202 can be appropriately discharged at the discharge portion 1a1, 1b1 in the first drive circuit 201. Therefore, damaging of a circuit element, a part of which is configured by the third element forming portion 1c2, can be prevented.

While the first drive circuit 201, the second drive circuit 202, and the third drive circuit 203 are drawn as being adjacent to one another in FIG. 5, a different drive circuit can be further interposed between the first drive circuit 201 and the second drive circuit 202 and between the second drive circuit 202 and the third drive circuit 203. In other words, each conductor pattern (for example, the second conductor pattern 1b) in the plurality of drive circuits can comprise an element forming portion (the third element forming portion 1c2, for example) in a different drive circuit being apart by two or more stages.

Specifically, the fourth conductor pattern 1d is connected to the gate of the TFT 31 (see FIG. 1) of the pixel drive circuit 3a provided to each one of the plurality of pixels 3. In other words, the fourth conductor pattern 1d in the example in FIG. 5 configures a gate line through which a gate signal to be supplied to each of the pixel drive circuits 3a is transmitted. Therefore, the fourth conductor pattern 1d can be formed over substantially the entire length of one side (one side being orthogonal to the direction in which the plurality of drive circuits 2 is arranged) of the display panel 1 having a planar shape being substantially rectangular as shown in FIG. 1. Therefore, the fourth conductor pattern 1d can have a large area and can be highly charged.

In the example in FIG. 5, in each one of the first to third drive circuits 201 to 203, the fourth conductor pattern 1d that can easily be charged in this way and in which, therefore, the ESD is likely to occur and the second conductor pattern 1b are insulated at two locations as shown with reference numerals S1 and S2. However, the insulation distance at each of the two locations S1, S2 are extremely short. In the example in FIG. 5, the insulation distance at each of the two locations S1, S2 are relatively short, and, in particular, the insulation distance at the location shown with the reference numeral S1 is shorter than the interval between the first conductor pattern 1a and the second conductor pattern 1b at the discharge portions 1a1, 1b1. At the two locations S1, S2 at which the insulation distance is short in this way, the ESD is likely to occur in conjunction with great charging of the fourth conductor pattern 1d. In that case, a high voltage (surge voltage) in conjunction with charging of the fourth conductor pattern 1d is also applied to the second conductor pattern 1b. Even in such a case, the discharge portions 1a1, 1b1 are provided in the present embodiment, so that damaging of the TFT 21a and/or the TFT 21b due to the ESD between the first conductor pattern 1a and the second conductor pattern 1b can be prevented.

Moreover, in the example in FIG. 5, the second conductor pattern 1b of the first drive circuit 201 and the fourth conductor pattern 1d of the second drive circuit 202 are insulated at least at two locations being shown with the reference numerals S1 and S3. However, the insulation distance at the location shown with the reference numeral S3 is also extremely short in the same manner as the insulation distance at the location shown with the reference numeral S1. Therefore, the ESD can occur even at these two locations, in which case, a surge voltage from the fourth conductor pattern 1d of the second drive circuit 202 is applied to the second conductor pattern 1b of the first drive circuit 201. However, according to the present embodiment, the discharge portions 1a1, 1b1 are provided in each one of the plurality of drive circuits, so that damaging of the circuit element such as the TFT 21a is prevented in any one of the plurality of drive circuits. The second conductor pattern 1b and the fourth conductor pattern 1d can be insulated at one location or three or more locations. Furthermore, in a case that the second conductor pattern 1b is connected to the trunk line pattern 1t, the first conductor pattern 1a and the fourth conductor pattern 1d can be insulated at the insulation distance being shorter than the interval between the first conductor pattern 1a and the second conductor pattern 1b at the discharge patterns 1a1, 1b1, for example.

Incidentally, in the example in FIG. 5, the first element forming portion 1a2 and the second element forming portion 1b2 configuring a part of the first circuit element (the TFT 21a) and the second circuit element (the TFT 21b), respectively, in the same drive circuit of the one or more drive circuits 201 to 203, face each other in a first direction. Here, the "first direction" is a direction in which the image display portion 30 faces each of the drive circuits 201 to 203 (a direction being orthogonal to the arrangement direction of each of the drive circuits 201 to 203 and being an X direction shown in FIGS. 1 and 5). Each of the first outer edge 1a4, of the first element forming portion 1a2, being an edge toward the second conductor pattern 1b and the second outer edge 1b4, of the second element forming portion 1b2, being an edge toward the first conductor pattern 1a extends along a second direction crossing the first direction. Then, a conductor film (the drain electrode 26a and the source electrode 25b in the example in FIG. 5) overlapping, via the insulating layer 13 (see FIG. 3), with the first outer edge 1a4 or the second outer edge 1b4 is formed for at least one of the first outer edge 1a4 and the second outer edge 1b4.

As described previously, the trunk line pattern 1t, and the fourth conductor pattern 1d extending toward the image display portion 30 to configure the gate line are likely to be charged to a high degree. Therefore, it is believed that, as in the example in FIG. 5, when each of the drive circuits 201 to 203 is provided between the trunk line pattern 1t and the image display portion 30, the ESD induced by charging of the trunk line pattern 1t and the gate line is likely to occur along the first direction in which the image display portion 30 faces each of the drive circuits 201 to 203. Therefore, in a case that there are no discharge portions 1a1, 1a2, the ESD is likely to occur between the first outer edge 1a4 and the second outer edge 1b4 in the first conductor pattern 1a and the second conductor pattern 1b, in which case, a gate insulating layer (not shown) on the first outer edge 1a4 and/or the second outer edge 1b4 is damaged. Then, when a conductor film such as the drain electrode 26a and the source electrode 25b is formed so as to overlap the first outer edge 1a4 and the second outer edge 1b4 as in the example in FIG. 5, a leakage can occur between the gate and the source of the TFT 21a, for example. However, according to the present embodiment, the discharge portions 1a1, 1b1 are provided, so that the ESD between the first outer edge 1a4 and the second outer edge 1b4 can be prevented, and normal functioning thereof can be obtained even if a plurality of drive circuits is arranged as in the example in FIG. 5.

[Method for Manufacturing Display Panel]

With the display panel 1 shown in FIGS. 1 and 3 as an example, a method for manufacturing display panel according to embodiment 2 is described with reference to flow-charts in FIGS. 6A and 6B, and, also with reference again to FIGS. 3 and 4A.

Figure 6A:
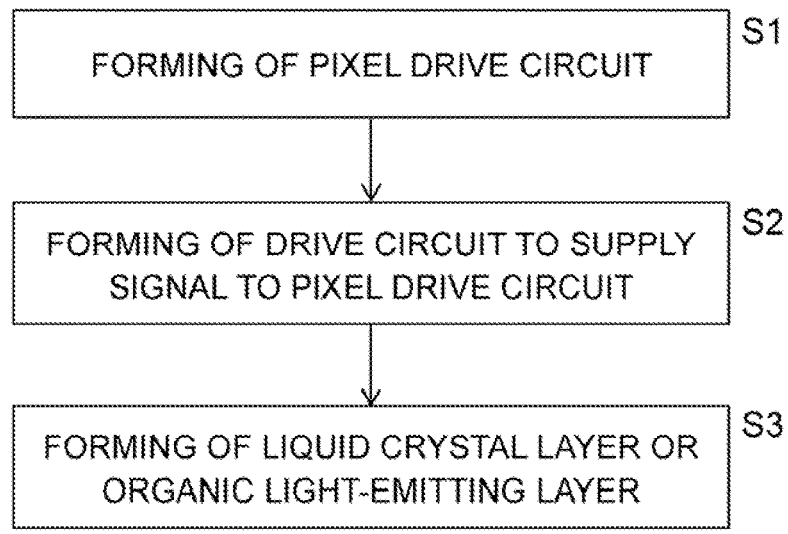
FIG. 6A shows a flowchart of one example of a method for manufacturing display panel according to embodiment 2 of the present invention.

As shown in FIG. 3, the method for manufacturing display panel according to the present embodiment at least comprises: forming a pixel drive circuit 3a by forming a plurality of thin-film transistors (TFTs) 31 on a surface of a substrate 10 (S1 in FIG. 6A); forming a plurality of pixels 3 (see FIG. 1) by forming a liquid crystal layer LC or an organic light-emitting layer (not shown) on the pixel drive circuit 3a (S3 in FIG. 6A); and forming a drive circuit 2 to supply a signal to the pixel drive circuit 3a by forming at least one circuit element (such as TFT 21) in a region to be the outside of the plurality of pixels 3 on the surface of the substrate 10 (S2 in FIG. 6A). Forming circuit element such as the TFT 31 configuring the pixel drive circuit 3a and circuit element such as the TFT 21 configuring the drive circuit 2 are preferably carried out simultaneously. A liquid crystal layer LC and an organic light-emitting layer (not shown) are formed with a general method, so that explanations thereof will be omitted.

Figure 6B:
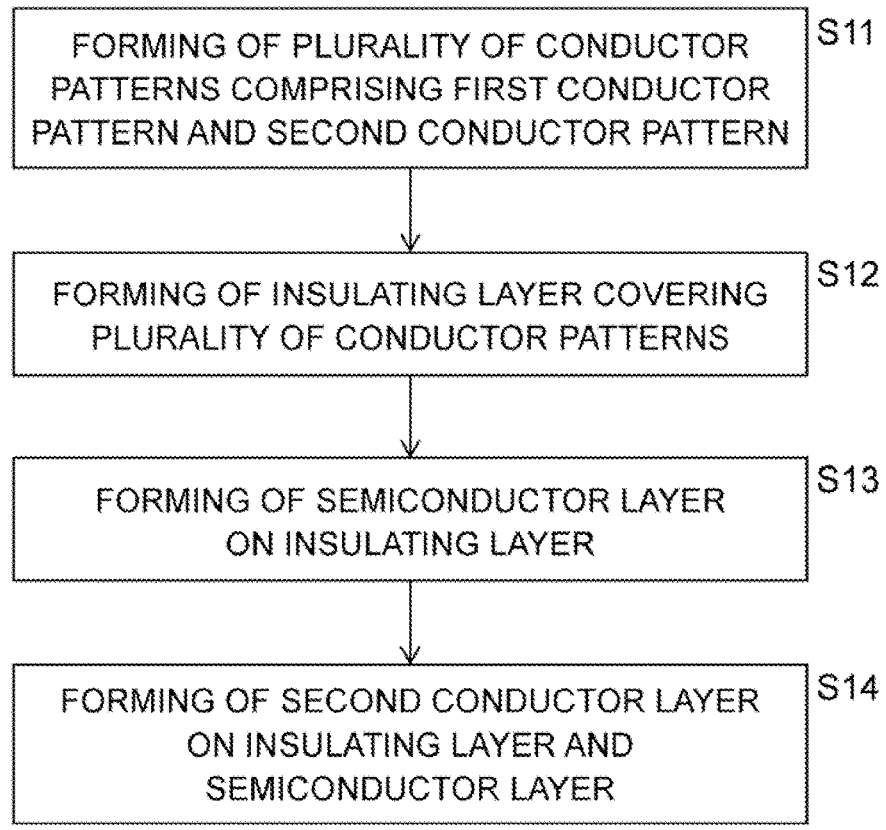
FIG. 6B shows a flowchart of one example of a forming procedure for the drive circuit of the method for manufacturing display panel according to embodiment 2 of the present invention.

In the method for manufacturing display panel according to the present embodiment, in the forming of the drive circuit 2 and the pixel drive circuit 3a, a plurality of conductor patterns configuring a part of the drive circuit 2 and being electrically separated from each other is formed on the surface of the substrate 10 (S11 in FIG. 6B). In this forming of the plurality of conductor patterns, a first conductor pattern 1a comprising a first element forming portion 1a2 configuring a part of the TFT 21a being a first circuit element of the drive circuit 2 and a second conductor pattern 1b comprising a second element forming portion 1b2 configuring a part of the TFT 21b being a second circuit element of the drive circuit 2 are formed. Moreover, as shown in FIG. 4A, in the forming of the first conductor pattern 1a and the second conductor pattern 1b, discharge portions 1a1, 1b1 are provided to at least one of the first conductor pattern 1a and the second conductor pattern 1b. The discharge portions 1a1, 1b1 narrows the interval between the first conductor pattern 1a and the second conductor pattern 1b so as to be partially narrower than the interval between the first element forming portion 1a2 and the second element forming portion 1b2.

Either the discharge portions 1a1 or the discharge portion 1b1 alone can also be provided.

Forming of the drive circuit 2 is described with a case in which a TFT configuring the drive circuit 2 such as the TFT 21 is a bottom-gate type amorphous silicon transistor as an example. The circuit element such as the TFT 31 configuring the pixel drive circuit 3a can also be formed in the same manner as the TFT 21 except for forming of the discharge portions 1a1, 1b1.

First, a first conductor layer 11 is formed by a layer of a metal such as tungsten or molybdenum being formed on the surface of the substrate 10 (see FIG. 3) by sputtering. In the display panel 1 shown in FIG. 3, the first conductor layer 11 is a gate metal layer comprising the gate electrode of each of TFTs configuring the drive circuit 2 or the pixel drive circuit 3a. Then, the first conductor layer 11 is patterned by forming an etching resist using photolithography techniques and dry or wet etching. As a result, as shown in FIG. 4A, a plurality of conductor patterns comprising the first conductor pattern 1a and the second conductor pattern 1b are formed. At this time, an etching resist covering forming regions of the first and second element forming portions 1a2, 1b2, and forming regions of the discharge portions 1a1, 1b1 is formed by using an exposure mask having an opening suitable for forming the first and second element forming portions 1a2, 1b2 and the discharge portions 1a1, 1b1. Then, the first and second element forming portions 1a2, 1b2, and either one of or both the discharge portions 1a1, 1b1 are formed properly by dry or wet etching being carried out using the etching resist. The first and second element forming portions 1a2, 1b2 can configure the gate electrode 22a of the TFT 21a configuring the drive circuit 2. In the first conductor layer 11, a conductor pattern and a wiring pattern configuring other circuit elements needed for forming the drive circuit 2 and the pixel drive circuit 3a can also be formed.

As shown in FIG. 3, an insulating layer 13 covering a plurality of conductor patterns of the first conductor layer 11 is formed (S12 in FIG. 6B). The insulating layer 13 is formed by forming a layer of $SiO_2$ or $SiN_X$ using plasma CVD, for example. Preferably, the process of forming the layer is repeated a plurality of times to form the insulating layer 13. A part of the insulating layer 13 configures a gate insulating layer of each of the TFTs configuring the drive circuit 2 or the pixel drive circuit 3a. Moreover, a semiconductor layer 23 is formed on the insulating layer 13 using the plasma CVD, for example (S13 in FIG. 6B). The semiconductor layer 23 is patterned in a desired shape using dry etching, for example. Thereafter, a contact layer 24 is preferably formed on the semiconductor layer 23 using a semiconductor having a high impurities concentration. The contact layer 24 can be formed by doping a predetermined region of the semiconductor layer 23 with impurities such as phosphorus or boron.

Then, as shown in FIG. 3, a second conductor layer 12 is formed on the semiconductor layer 23 (or the contact layer 24) and the insulating layer 13 (S14 in FIG. 6B). In the example in FIG. 3, the second conductor layer 12 is a source metal layer comprising the source electrode and the drain electrode of each of the TFTs configuring the drive circuit 2 or the pixel drive circuit 3a. For example, a layer of tungsten or titanium is formed using sputtering, and the formed layer is separated into a source electrode 25 and a drain electrode 26 by dry or wet etching, for example. Thereafter, a planarizing layer 14a consisting of, for example, $SiO_2$ or $SiN_X$ is formed by CVD, for example. Moreover, each of constituting elements needed for image displaying using liquid crystal molecules, such as the liquid crystal layer LC, is formed on the planarizing layer 14a. Alternatively, an organic light-emitting element is formed by vapor deposition of an organic light-emitting material. The display panel 1 exemplified in FIGS. 1 and 3 is completed by undergoing the processes in the above.

In the method for manufacturing display panel according to the present embodiment, the discharge portion 1a1 or the discharge portion 1b1 is formed in at least either one of the first conductor pattern 1a and the second conductor pattern 1b each configuring a part of a circuit element configuring the drive circuit 2. Therefore, the ESD that can occur in an arbitrary process after forming of the first conductor layer 11 can be induced in a portion other than the first and second element forming portions 1a2, 1b2. For example, a large number of electric charges being accumulated in a conductor pattern having a large area, such as the trunk line pattern 1t (see FIG. 5), and a conductor pattern configuring the gate line, in forming of the insulating layer 13 can be discharged at a portion other than the first and second element forming portions 1a2, 1b2. Therefore, a circuit element configured by the first and second element forming portions 1a2, 1b2 can be protected from ESD discharging, thus improving the yield of the display panel. Moreover, the insulating layer 13 not being damaged at proximity to the first and second element forming portions 1a2, 1b2 can be obtained, and it is possible to also reduce a potential failure of the display panel 1.

CONCLUSION (1) A display panel according to a first embodiment of the present invention comprises: a plurality of pixels being formed on a surface of a substrate and being arranged in a matrix; one or more drive circuits being formed outside an image display portion configured by the plurality of pixels on the surface to supply a signal to pixels being lined up in a same row or a same column in the plurality of pixels; and a plurality of conductor patterns being formed on the surface and being electrically separated from each other, each one of the plurality of conductor patterns configuring a part of the drive circuit, wherein the plurality of conductor patterns comprises a first conductor pattern comprising a first element forming portion configuring a part of a first circuit element of any of the one or more drive circuits and a second conductor pattern comprising a second element forming portion configuring a part of a second circuit element of any of the one or more drive circuits; and a discharge portion is provided to at least one of the first conductor pattern and the second conductor pattern, wherein the discharge portion narrows an interval between the first conductor pattern and the second conductor pattern so as to be partially narrower than an interval between the first element forming portion and the second element forming portion.

The configuration according to (1) makes it possible to avoid damaging of a drive circuit due to ESD, such as to hinder displaying of an image in a display panel comprising, at the interior thereof, a drive circuit to supply a signal to each of pixels being lined up in each of rows or each of columns.

(2) In the display panel according to (1) mentioned above, the discharge portion being provided to the first conductor pattern can project toward the second conductor pattern from a first outer edge of the first element forming portion, the first outer edge being an edge toward the second conductor pattern, and/or the discharge portion being provided to the second conductor pattern can project toward the first conductor pattern from a second outer edge of the second element forming portion, the second outer edge being an edge toward the first conductor pattern. In that case, ESD can be induced at a location, of a first conductor pattern or a second conductor pattern, being distant from an element forming portion; therefore, it is possible to protect a circuit element of a drive circuit more surely.

(3) In the display panel according to (2) mentioned above, a length of a projection of the discharge portion can be longer than an interval between the first conductor pattern and the second conductor pattern at the discharge portion. In that case, ESD occurring at the discharge portion affecting a circuit element configuring a drive circuit 2 can be avoided.

(4) In the display panel according to (2) or (3) mentioned above, a conductor film overlapping, via an insulating layer, with at least one of the first outer edge and the second outer edge can be formed for the at least one of the first outer edge and the second outer edge. In such a case, normal functioning of a drive circuit can be obtained even when ESD occurs.

(5) In the display panel according to any one of (2) to (4) mentioned above, the first circuit element and the second circuit element can be circuit elements of the same drive circuit; the first element forming portion and the second element forming portion can face each other in a first direction in which the image display portion and the drive circuit face each other; and the first outer edge and the second outer edge can extend in a second direction crossing with the first direction. Even when the first outer edge and the second outer edge are provided in this way, ESD between the first outer edge 1a4 and the second outer edge 1b4 can be prevented.

(6) In the display panel according to any one of (1) to (5) mentioned above, the first conductor pattern can further comprise a trunk line pattern configuring a common wiring to input a predetermined signal to each of the one or more drive circuits; and the first element forming portion can be directly connected to the trunk line pattern. In that case, a circuit element having a high risk of being broken by ESD can be protected.

(7) In the display panel according to (6) mentioned above, the second conductor pattern can extend over a first drive circuit of the one or more drive circuits and a second drive circuit different from the first drive circuit; the second circuit element can be a circuit element of the first drive circuit; and the second conductor pattern can further comprise a third element forming portion configuring a part of a third circuit element of the second drive circuit. In that case, electric charges being accumulated in an element forming portion of one drive circuit, the element forming portion not comprising a discharge portion, can be discharged appropriately at a discharge portion being provided in another drive circuit; therefore, it is possible to prevent damaging of a circuit element.

(8) In the display panel according to any one of (1) to (7) mentioned above, the plurality of conductor patterns can further comprise a fourth conductor pattern to be connected to a pixel drive circuit provided to each one of the plurality of pixels; the first conductor pattern or the second conductor pattern, and the fourth conductor pattern can be insulated at one or a plurality of locations; and the insulating distance at each of the one or the plurality of locations can be shorter than an interval between the first conductor pattern and the second conductor pattern at the discharge portion. Even in such a case that there is a risk of electric conduction via ESD to a conductor pattern that can be highly charged, electric charges being charged can be appropriately discharged, in the display panel according to any one of (1) to (8).

(9) In the display panel according to any one of (1) to (8) mentioned above, the first conductor pattern or the second conductor pattern can have the largest area in the plurality of conductor patterns. In that case, a circuit element having a high risk of being broken by ESD can be protected.

(10) In the display panel according to any one of (1) to (9) mentioned above, a plurality of drive circuits being the one or more drive circuits can be formed; and the discharge portion can be provided in each one of the plurality of drive circuits. In that case, damaging due to ESD in any one of the plurality of drive circuits can be prevented.

(11) A method for manufacturing display panel according to a second embodiment of the present invention at least comprises: forming a pixel drive circuit by forming a plurality of thin-film transistors on a surface of a substrate; forming a plurality of pixels by forming a liquid crystal layer or an organic light-emitting layer on the pixel drive circuit; and forming a drive circuit to supply a signal to the pixel drive circuit by forming at least one circuit element in a region to be outside of the plurality of pixels on the surface, wherein in forming of the drive circuit and the pixel drive circuit, a plurality of conductor patterns configuring a part of the drive circuit and being electrically separated from each other is formed on the surface of the substrate; in forming of the plurality of conductor patterns, a first conductor pattern and a second conductor pattern are formed, the first conductor pattern comprising a first element forming portion configuring a part of a first circuit element of the drive circuit and the second conductor pattern comprising a second element forming portion configuring a part of a second circuit element of the drive circuit; and in forming of the first conductor pattern and the second conductor pattern, a discharge portion is provided to at least one of the first conductor pattern and the second conductor pattern, wherein the discharge portion narrows an interval between the first conductor pattern and the second conductor pattern so as to be partially narrower than an interval between the first element forming portion and the second element forming portion.

The configuration according to (11) makes it possible to manufacture a display panel comprising, at the interior thereof, a drive circuit not being damaged in such a manner as to hinder displaying of an image.

DESCRIPTION OF REFERENCE NUMERALS

1 DISPLAY PANEL
10 SUBSTRATE
11 FIRST CONDUCTOR LAYER (GATE METAL LAYER)
1a FIRST CONDUCTOR PATTERN
1a1 DISCHARGE PORTION
1a2 FIRST ELEMENT FORMING PORTION
1a4 FIRST OUTER EDGE
1b SECOND CONDUCTOR PATTERN
1b1 DISCHARGE PORTION
1b2 SECOND ELEMENT FORMING PORTION
1b4 SECOND OUTER EDGE
1c2 THIRD ELEMENT FORMING PORTION
1d FOURTH CONDUCTOR PATTERN (GATE LINE)
1t TRUNK LINE PATTERN
12 SECOND CONDUCTOR LAYER (SOURCE METAL LAYER)
13 INSULATING LAYER (GATE INSULATING LAYER)
2 DRIVE CIRCUIT (GATE DRIVER)
201 to 203 FIRST TO THIRD DRIVE CIRCUIT

20 COMMON WIRING
21, 21a to 21e THIN-FILM TRANSISTOR (TFT)
3 PIXEL
30 IMAGE DISPLAY PORTION
3a PIXEL DRIVE CIRCUIT

The invention claimed is:

1. A display panel comprising:
a plurality of pixels being formed on a surface of a substrate and being arranged in a matrix;
one or more drive circuits being formed, on the surface, outside an image display portion configured by the plurality of pixels to supply a signal to pixels being lined up in a same row or a same column in the plurality of pixels; and
a plurality of conductor patterns being formed on the surface and being electrically separated from each other, each one of the plurality of conductor patterns configuring a part of the drive circuit, wherein
the plurality of conductor patterns comprises a first conductor pattern comprising a first element forming portion and a second conductor pattern comprising a second element forming portion,
the first element forming portion is included in any one of the one or more drive circuits and configures a part of a first circuit element included in the one of the one or more drive circuits,
the second element forming portion is included in the one of the one or more drive circuits and configures a part of a second circuit element included in the one of the one or more drive circuits,
at least one of the first circuit element and the second circuit element is a thin film transistor; and
a discharge portion is provided to at least one of the first conductor pattern and the second conductor pattern, wherein the discharge portion projects from at least one of the first element forming portion and the second element forming portion, and wherein the discharge portion narrows an interval between the first conductor pattern and the second conductor pattern so as to be partially narrower than an interval between the first element forming portion and the second element forming portion.

2. The display panel according to claim 1, wherein the discharge portion being provided to the first conductor pattern projects toward the second conductor pattern from a first outer edge of the first element forming portion, the first outer edge being an edge on a second conductor pattern side, and/or the discharge portion being provided to the second conductor pattern projects toward the first conductor pattern from a second outer edge of the second element forming portion, the second outer edge being an edge on a first conductor pattern side.

3. The display panel according to claim 2, wherein a length of a projection of the discharge portion is longer than an interval between the first conductor pattern and the second conductor pattern at the discharge portion.

4. The display panel according to claim 2, wherein a conductor film overlapping, via an insulating layer, with at least one of the first outer edge and the second outer edge is formed for the at least one of the first outer edge and the second outer edge.

5. The display panel according to claim 2, wherein
the first circuit element and the second circuit element are circuit elements of the same drive circuit;
the first element forming portion and the second element forming portion face each other in a first direction in which the image display portion and the drive circuit face each other; and
the first outer edge and the second outer edge extend in a second direction crossing with the first direction.

6. The display panel according to claim 1, wherein
the first conductor pattern further comprises a trunk line pattern configuring a common wiring to input a predetermined signal to each of the one or more drive circuits; and
the first element forming portion is directly connected to the trunk line pattern.

7. The display panel according to claim 6, wherein
the second conductor pattern extends over a first drive circuit of the one or more drive circuits and a second drive circuit different from the first drive circuit;
the second circuit element is a circuit element of the first drive circuit; and
the second conductor pattern further comprises a third element forming portion configuring a part of a third circuit element of the second drive circuit.

8. The display panel according to claim 1, wherein
the plurality of conductor patterns further comprises a fourth conductor pattern to be connected to a pixel drive circuit provided to each one of the plurality of pixels;
the first conductor pattern or the second conductor pattern, and the fourth conductor pattern are insulated at one or a plurality of locations; and
the insulation distance at each of the one or the plurality of locations is shorter than an interval between the first conductor pattern and the second conductor pattern at the discharge portion.

9. The display panel according to claim 1, wherein the first conductor pattern or the second conductor pattern has the largest area in the plurality of conductor patterns.

10. The display panel according to claim 1, wherein
a plurality of drive circuits being the one or more drive circuits is formed; and
the discharge portion is provided in each one of the plurality of drive circuits.

11. A method for manufacturing display panel, the method at least comprising:
forming a pixel drive circuit by forming a plurality of thin-film transistors on a surface of a substrate;
forming a plurality of pixels by forming a liquid crystal layer or an organic light-emitting layer on the pixel drive circuit; and
forming a drive circuit, on the surface, to supply a signal to the pixel drive circuit by forming at least one circuit element in a region to be outside of the plurality of pixels, wherein
in forming of the drive circuit and the pixel drive circuit, a plurality of conductor patterns configuring a part of the drive circuit and being electrically separated from each other is formed on the surface of the substrate;
in forming of the plurality of conductor patterns, a first conductor pattern and a second conductor pattern are formed, the first conductor pattern comprising a first element forming portion and the second conductor pattern comprising a second element forming portion, wherein the first element forming portion is included in the drive circuit and configures a part of a first circuit element included in the drive circuit, the second element forming portion is included in the drive circuit and configures a part of a second circuit element included in the drive circuit, and at least one of the first circuit element and the second circuit element is a thin film transistor; and in forming of the first conductor pattern and the second conductor pattern, a discharge portion is provided to at least one of the first conductor pattern and the second conductor pattern, wherein the discharge portion projects from at least one of the first element forming portion and the second element forming portion, and wherein the discharge portion narrows an interval between the first conductor pattern and the second conductor pattern so as to be partially narrower than an interval between the first element forming portion and the second element forming portion.

12. The display panel according to claim 1, wherein the first circuit element consists of a thin film transistor.

13. The display panel according to claim 12, wherein the first element forming portion configures a gate electrode of the thin film transistor configuring the first circuit element, and the discharge portion projects from the gate electrode of the thin film transistor configuring the first circuit element.

14. The method for manufacturing display panel according to claim 11, wherein the first circuit element consists of a thin film transistor.

15. The method for manufacturing display panel according to claim 14, wherein the first element forming portion configures a gate electrode of the thin film transistor configuring the first circuit element, and the discharge portion projects from the gate electrode of the thin film transistor configuring the first circuit element.

16. The display panel according to claim 4, wherein a distance from a portion to which the discharge portion is provided on the at least one of the first outer edge and the second outer edge to a portion of the at least one of the first outer edge and the second outer edge overlapping with the conductor film via the insulating layer is larger than a width of the discharge portion.

17. The display panel according to claim 2, wherein the discharge portion extends from at least one of the first outer edge and the second outer edge in a direction orthogonal to the at least one of the first outer edge and the second outer edge in planer view, and a length of the discharge portion in the direction is larger than a width of the discharge portion.

* * * * *